United States Patent [19]

O'Rourke

[11] Patent Number: 4,562,410

[45] Date of Patent: Dec. 31, 1985

[54] PHASE LOCK LOOP PREPOSITIONING APPARATUS WITH FEEDBACK CONTROL

[75] Inventor: David P. O'Rourke, Philadelphia, Pa.

[73] Assignee: RCA Corporation, Princeton, N.J.

[21] Appl. No.: 566,794

[22] Filed: Dec. 29, 1983

[51] Int. Cl.[4] .............................................. H03L 7/00
[52] U.S. Cl. ...................................... 331/1 A; 331/25
[58] Field of Search ...................... 331/1 A, 14, 17, 25

[56] References Cited

U.S. PATENT DOCUMENTS

| | | | |
|---|---|---|---|
| 3,694,776 | 9/1972 | Linder | 333/17 |
| 3,714,463 | 1/1973 | Laune | 307/232 |
| 4,105,948 | 8/1978 | Wolkstein | 331/14 |
| 4,138,650 | 2/1979 | Anderson | 331/1 A |
| 4,156,855 | 5/1979 | Crowley | 331/1 A |
| 4,272,729 | 6/1981 | Riley, Jr. | 331/1 A |
| 4,280,104 | 7/1981 | Rzeszewski | 331/1 A |
| 4,320,530 | 3/1982 | Ikeda | 455/182 |
| 4,410,860 | 10/1983 | Kipp et al. | 331/1 A |

Primary Examiner—Eugene R. LaRoche
Assistant Examiner—G. Wan
Attorney, Agent, or Firm—Joseph S. Tripoli; Robert L. Troike; Christopher L. Maginniss

[57] ABSTRACT

A feedback-controlled current pump is coupled to the loop filter capacitor of a phase lock loop to provide a coarse prepositioning voltage and thereby accelerate the lockup process on a new frequency. Two voltage comparators monitor the capacitor voltage with respect to a selectable "window" centered about the desired voltage, and when the capacitor has been charged or discharged to a voltage within the window, the current pump providing the charging or discharging current to the capacitor is shut off.

13 Claims, 2 Drawing Figures

PHASE LOCK LOOP PREPOSITIONING APPARATUS WITH FEEDBACK CONTROL

BACKGROUND OF THE INVENTION

The Government has rights in this invention pursuant to Contract No. DAAK20-81-C-0376, awarded by the Department of the Army.

This invention relates to phase lock loops and, more particularly, to an apparatus which prepositions a phase lock loop by providing a high rate of charging or discharging current to the loop filter capacitor for a fixed period of time.

There are many systems in which it is necessary to switch a signal generator from one frequency to another at high speed, with a minimum of time spent in transition between frequencies. Such a system is a frequency-hopping radio communication system in which, for purposes of communications security and jam-resistant operation, the carrier signal frequency is switched among as many as one hundred RF frequencies at a switching rate, for example, of one KHz. Since, in this example, there is a carrier frequency change every millisecond, it is important that as much of each millisecond be available for data transmission as is possible, by minimizing the unusable switching time between frequencies.

Most systems of this type, including the frequency-hopping systems mentioned above, use frequency synthesizers which include phase lock loops. Although these synthesizers are capable of high precision performance, their transition speed between frequencies, i.e., time to lock on a new frequency, can be intolerably slow and, in cases where the loop includes built-in frequency range restrictions such as mixers and filters in the loop feedback path, the loop may be entirely unable to lock on a new frequency.

In one prior art apparatus for rapidly changing frequency in a phase lock loop frequency synthesizer, disclosed in U.S. Pat. No. 4,105,948, issued Aug. 8, 1978, to Wolkstein, a frequency change is effected by opening the loop between the filter and the voltage-controlled oscillator (VCO) and applying an external tuning voltage to the VCO until the loop settles at the new frequency. This procedure is time consuming since the loop will not settle until the loop filter capacitor has charged or discharged to the new voltage, and this charge/discharge rate is limited by low current drive capability of the phase detector.

It is also known generally to supply current directly to the loop filter capacitor of a phase lock loop to hasten the development of the control signal applied to the loop VCO. This current charges (or discharges) the capacitor to thereby provide a voltage approximating the tuning voltage required for the new frequency. Prior art phase lock loops with this tuning capability have employed the charge pump generally included within the phase detector circuitry. This charge pump is usually a very low current device, typically providing a maximum current of 30 milliamperes, and the prior art systems have boosted its current flow capability by either switching in a lower value current-limiting resistor in the output circuit, or by increasing the gain of the charge pump drive transistors by switching resistors in their base circuits. These switching modifications do not provide actual prepositioning—they merely hasten the time required for lock. True prepositioning would supply a known voltage across the filter capacitor, where that voltage is related to the new frequency sought to be locked on.

SUMMARY OF THE INVENTION

In accordance with the principles of the present invention, an apparatus is disclosed for use in a phase lock loop which includes a loop filter capacitor and a voltage-controlled oscillator (VCO). The VCO is responsive to the dc voltage level at one electrode of the capacitor for determining its frequency of oscillation. The disclosed apparatus alters the oscillation of the VCO from a first frequency to a second frequency. The apparatus includes source means for providing a dc signal having a voltage level corresponding to the second frequency, and means for comparing the source means dc signal voltage level with the capacitor dc voltage level. The apparatus further includes means responsive to the comparing means for providing current to the capacitor when the voltage level of the source means dc signal is unequal to the dc voltage level at the capacitor electrode.

BRIEF DESCRIPTION OF THE DRAWINGS

Other features and advantages of the present invention will be more fully understood from the following detailed description of two embodiments, the appended claims, and the accompanying drawing, in which:

DESCRIPTION OF THE PREFERRED EMBODIMENTS

Figure 1:
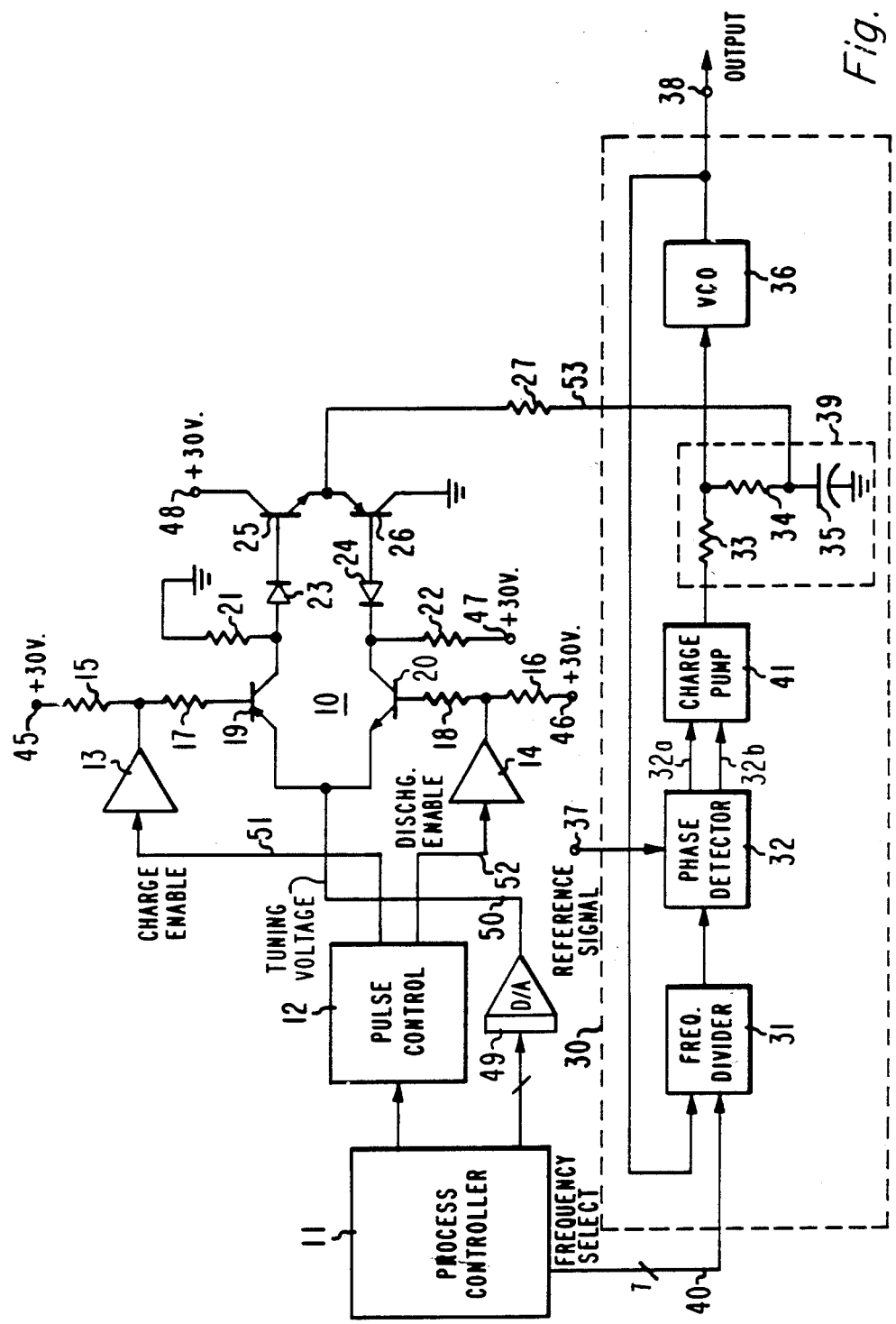
FIG. 1 is a schematic representation of a first embodiment of the present invention.

Referring to FIG. 1, there is illustrated a phase lock loop 30, functioning as part of a frequency synthesizer. Phase lock loop 30 generates, at its output terminal 38, output signals which are specific frequency multiples of an input reference signal frequency. The reference signal, applied at input terminal 37, is coupled to phase detector 32 which compares the reference signal frequency with the frequency of the output signal generated by programmable frequency divider 31.

Phase detector 32 typically produces in response to a phase difference between its input signals either a pulsed output signal on line 32a indicating charge (to increase the frequency of VCO 36) or a pulsed output signal on line 32b indicating discharge (to decrease the frequency of VCO 36), wherein the pulse width and spacing depend on the relative frequency and phase of its input signals. Charge pump 41 receives the pulsed signals from phase detector 32 on either line 32a or line 32b, and feeds for charging a current sourcing and for discharging a current sinking pulsed signal to low pass filter network 39 which filters out the pulsations so that a smooth more positive or more negative dc voltage level can be derived to control VCO 36. Loop filter 39 comprises resistors 33 and 34 and loop filter capacitor 35.

The oscillator 36 output signal is fed back to programmable frequency divider 31 which performs a divide-by-N function on the frequency of its input signal. The output signal of programmable frequency divider 31 is applied to one input terminal of phase detector 32, as indicated above.

The value of the division factor, N, of programmable frequency divider 31, is determined by the frequency select signals applied to it by process controller 11 on signal leads 40. Process controller 11 is, for example, a microprocessor programmed to generate upon selection a predetermined sequence of one hundred different binary signals representative of a sequence of one hundred frequencies. The embodiment of the present invention is capable of synthesizing one hundred frequencies, illustratively between 230 and 400 MHz; hence, in the illustrated example, seven signal leads 40 will provide the required one hundred different encoded values. Process controller 11 also supplies a binary signal corresponding to tuning voltage levels for each frequency.

In accordance with the present invention a current pump 10 and pulse control circuit 12 are coupled to phase lock loop 30 to provide high rates of charging and discharging currents to loop capacitor 35, typically up to a peak of 1.5 amperes, under the control of process controller 11. Current pump 10 includes switching transistors 19 and 20 which are selectively enabled by control signals generated by pulse control circuit 12. Transistors 19 and 20, when enabled, feed a tuning voltage signal, provided from process controller 11 via digital-to-analog (D/A) converter 49, to enable, respectively, drive transistors 25 and 26 which provide large charging and discharging currents, respectively, to loop capacitor 35. Switching transistors 19 and 20 are held enabled for a time sufficient to ensure that the desired potential across loop capacitor 35 has been achieved.

Considering the embodiment of FIG. 1 in greater detail, process controller 11 provides signals to pulse control circuit 12 which, when true, indicate that the voltage across loop capacitor 35 is to be changed and indicating also the direction of the change, i.e., charge or discharge. Pulse control circuit 12 responds to these signal indications by providing a fixed-width pulse on either signal lead 51 or 52. Circuit 12 may typically include two monostable multivibrators or one-shots, in a configuration well understood by those skilled in the art.

Buffers 13 and 14, coupled at their input terminals to signal leads 51 and 52, respectively, act as level shifters to the logic-level signals applied to their inputs. Buffers 13 and 14 typically are open-collector digital logic drivers capable of switching between 0 and 30 volts at their output terminals. Resistor 15, coupled between terminal 45 and buffer 13, acts as a load resistor for buffer 13. The output signal of buffer 13 is coupled through resistor 17 to base electrode of P-N-P transistor 19 which may be, for example, similar to type 2N2907A. In a similar manner, resistor 16, coupled between terminal 46 and buffer 14, acts as a load resistor for buffer 14. The output signal of buffer 14 is coupled through resistor 18 to the base electrode of N-P-N transistor 20 which may be, for example, similar to type 2N2222A. A source of 30 volts dc is coupled to terminals 45 and 46 to provide base currents to transistors 19 and 20, respectively.

Digital signals supplied by process controller 11 to D/A converter 49 produce a dc tuning voltage which is applied to the emitter electrodes of transistors 19 and 20. The collector electrode of transistor 19 is coupled via diode 23 to the base electrode of N-P-N transistor 25 which may be, for example, similar to type 2N2222A. The collector electrode of transistor 25 is coupled to terminal 48 to which a source of 30 volts dc is applied. Resistor 21, coupled between reference ground and the junction of transistor 19 and diode 23, acts as a pull-down resistor, enhancing the switching speed of transistor 19 by improving its fall time and ensuring cutoff of transistor 25 when transistor 19 is non-conducting. Diode 23 blocks the bias voltage of resistor 21 from the base electrode of transistor 25.

The collector electrode of transistor 20 is coupled via diode 24 to the base electrode of P-N-P transistor 26 which may be, for example, similar to type 2N2907A. The collector electrode of transistor 26 is coupled to reference ground. Resistor 22, coupled between terminal 47 and the junction of transistor 20 and diode 24, acts as a pull-up resistor, enhancing the switching speed of transistor 20 by improving its risetime and ensuring cutoff of transistor 26 when transistor 20 is non-conducting. In the present example, a source of 30 volts dc is coupled to terminal 47. Diode 24 blocks the bias voltage of resistor 22 from the base electrode of transistor 26.

Drive transistors 25 and 26 are connected together in an emitter booster configuration, coupled between a source of 30 volts dc applied at terminal 48 and ground. The junction of their emitters is coupled via current-limiting resistor 27 to the charging electrode of loop capacitor 35.

The operation of the apparatus of FIG. 1 proceeds as follows: process controller 11, determining that a change of output signal frequency is required from phase lock loop 30, alters the states of the frequency select signals coupled to frequency divider 31 to thereby change its division factor, applies appropriate digital signals to D/A converter 49 which produces a corresponding dc voltage level on tuning voltage signal lead 50, and signals a charge or discharge indication to pulse control circuit 12. Considering the case of the charge indication, i.e., an increased voltage is required across capacitor 35, pulse control circuit 12 pulses a signal on lead 51 which causes the output transistor of buffer 13 to switch from an open to a saturated state. This results in an effective ground being applied to the base of transistor 19, causing it to saturate and enabling base current to drive transistor 25. Neglecting, for the moment, diode and transistor junction voltage drops, transistor 25 will supply current from the source coupled at its collector through resistor 27 to capacitor 35, until the voltage across capacitor 35 has increased so as to be equal to the voltage at the base of transistor 25.

Considering now the case of the discharge indication from controller 11 to circuit 12, i.e., a decrease in voltage is required across capacitor 35, pulse control circuit 12 pulses a signal on lead 52 which causes the output transistor of buffer 14 to switch from a saturated to an open state. This results in an effective 30 volts dc being applied to the base of transistor 20, causing it to saturate and enabling base current to drive transistor 26. While still neglecting the effects of diode and transistor junction voltage drops, transistor 26 will sink current from loop capacitor 35, through resistor 27, to ground, until the voltage across capacitor 35 has decreased so as to be equal to the voltage at the base of transistor 26.

Thus, it is seen that current pump 10 and pulse control circuit 12, working under the control of process controller 11, provide charging and discharging currents to loop capacitor 35. It may be noted that the output signal lead 53 of current pump 10 is coupled directly to capacitor 35, without the need for switching devices. This is because when current pump 10 is supplying or sinking current, its high current flow capacity swamps out the effect of charge pump 41. Furthermore, when current pump 10 is inactive, both drive transistors 25 and 26 are turned off, appearing as a sufficiently high impedance to capacitor 35 that virtually no current leaks off that device back into current pump 10.

Returning to the earlier-neglected diode and transistor voltage drops, it is evident that, using real circuits, an accommodation must be made for the fact that the tuning voltage applied to the emitters of switching transistors 19 and 20 is not equal to the voltage applied to capacitor 35, due to drops across transistors 19 and 25 and diode 23 in one case, and due to drops across transistors 20 and 26 and diode 24 in the other case. Assuming typical diode and base-emitter drops of approximately 0.7 volt and an emitter-collector drop of 0.4 volt, that accommodation will typically be 1.8 volts. In short, it is easily seen than when current pump 10 is signaled into the charge mode, the tuning voltage level must be approximately 1.8 volts greater than the voltage ultimately desired across capacitor 35, and when current pump 10 is signaled into the discharge mode, the tuning voltage level must be approximately 1.8 volts less than the voltage ultimately desired across capacitor 35.

It has been mentioned throughout this description that pulse control circuit 12 generates pulses on signal leads 51 and 52. During these pulses it is presumed that the voltage across loop capacitor 35 is altered and brought to a steady-state level, whereupon current pump 10 turns off, leaving charge pump 41 to fine-tune the voltage applied to VCO 36. That presumption can be valid only if the pulse widths applied to buffers 13 and 14 are at least as long as the time required for current pump 10 to alter the voltage across capacitor 35 from one extreme of its range to the other. In other words, the pulse width applied on signal lead 51 must be at least as long as the time required to charge capacitor 35 from its lowest level to its highest level. Similarly, the pulse width applied on signal lead 52 must be at least as long as the time required to discharge capacitor 35 from its highest level to its lowest level. These pulse widths will depend on circuit parameters such as the capacitance of loop filter capacitor 35, the current flow along lead 53, and the settling time of phase lock loop 30. In a typical frequency-hopping application, where it is required that frequency changes occur within one hundred μseconds, the prepositioning pulse width may typically be ten μseconds, leaving the balance of the time for the loop to achieve the fine tuning.

It will be noted that current pump 10 has been shown as operating between dc supplies of 0 and 30 volts. These are arbitrary values chosen for this circuit realization as being well outside the range of voltages applied to capacitor 35, which may typically be 5 to 15 volts. A circuit as described above in connection with FIG. 1 was constructed and tested in which the components were of the following types and values:

Resistors 15, 17—15k ohm;
Resistor 16—30k ohm;
Resistor 18—1k ohm;
Resistors 21, 22—10k ohm;
Resistor 27—50ohm;
Diodes 23, 24—1N5711;
Transistors 19, 26—2N2907A; and
Transistors 20, 25—2N2222A.

A difference in base current requirements between transistors 29 and 20 accounts for the differences between resistors 15, 17 and resistors 16, 18, respectively.

Figure 2:
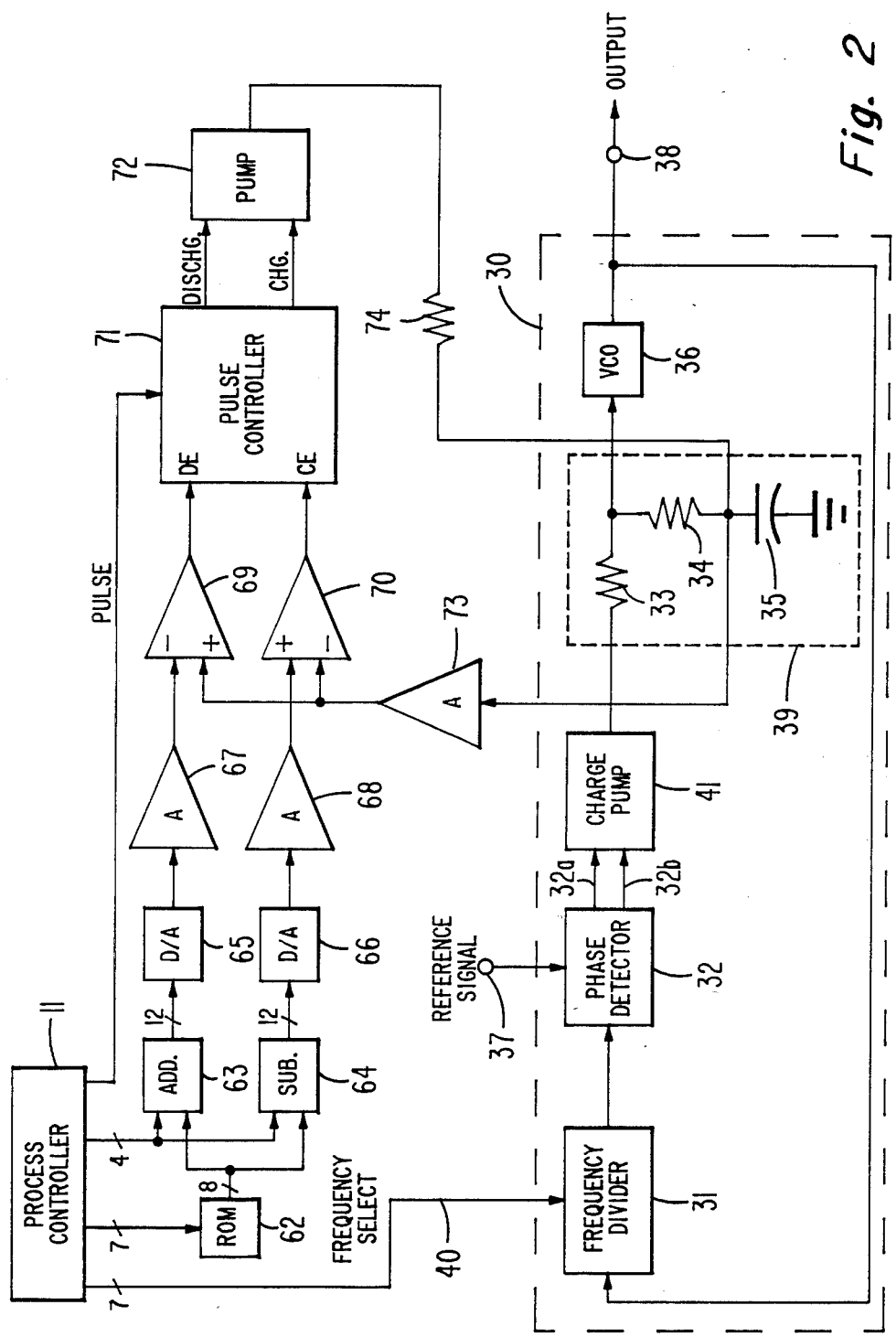
FIG. 2 is a second embodiment of the present invention.

In a second embodiment of the present invention, as shown in FIG. 2, circuit elements are added to phase lock loop 30 to provide prepositioning for VCO 36 by charging loop capacitor 35 to a voltage which approximates the control voltage required to cause VCO 36 to oscillate at the desired frequency. These added circuit elements comprise read only memory (ROM) 62, adder 63, subtracter 64, digital-to-analog (D/A) converters 65 and 66, amplifiers 67, 68, and 73, comparators 69 and 70, pulse controller 71 and current pump 72. These elements operate under the control of process controller 11 to provide the proper prepositioning voltage across loop filter capacitor 35.

The FIG. 2 embodiment provides more rapid charging and discharging of loop filter capacitor 35 by the closed-loop control of the charge pump. In this embodiment, the current pump biasing may permit its operation over a voltage range far wider than the range of prepositioning voltages to be applied to capacitor 35. Thus a more constant charging and discharging current flow may be realized, with the control of the current pump being governed by a comparison of the tuning voltage with capacitor voltage.

Referring to FIG. 2, ROM 62, which may typically comprise one hundred, eight-bit memory words, receives addressing signals from process controller 11 and responds by providing an eight-bit word which is applied to adder 63 and subtracter 64 on eight signal lines. Adder 63 and subtracter 64 also receive an offset data word from process controller 11, which word comprises, in the present example, four data bits. The memory data word from ROM 62 and the offset data word from controller 11 are combined in adder 63 and subtracter 64 so as to provide at their respective output terminals, digitally-encoded signals representing, respectively, the offset data word added to the ROM data word and the offset data word subtracted from the ROM data word.

In the embodiment of FIG. 2, the four-bit offset data word adds precision to the eight-bit ROM data word by becoming, in the case of adder 63, the four least significant bits in the twelve-bit data word output from adder 63. In the case of the subtracter 64, the offset data word is subtracted from the least significant bit of the ROM data word, resulting also in a twelve-bit output data word. The implementation of adder 63 and subtracter 64 and the form of their output data words is a matter of choice. What is taught herein is two circuits the value of whose outputs form a window which is symmetrical about thr ROM data word.

The binary-encoded output signals of adder 63 and subtracter 64 are applied, respectively, to digital-to-analog (D/A) converters 65 and 66 which convert the applied digital input signals to voltage levels corresponding to the digital values. The output signals of D/A converters 65 and 66 are applied, respectively, to amplifiers 67 and 68, which identically amplify the D/A output signals to levels corresponding to the output signal level of amplifier 73.

The output signal from amplifier 67 is applied to the negative (−) input terminal of comparator 69. The output signal from amplifier 68 is applied to the positive (+) input terminal of comparator 70. The (+) input terminal of comparator 69 and the (−) input terminal of comparator 70 are both coupled to the output terminal of amplifier 73. Comparators 69 and 70 are identical devices, each of which provides a logic level output signal of a first polarity when the voltage level at its (+) input terminal exceeds the voltage level at its (−) input terminal, and an output signal of a second polarity when the voltage level at its (−) terminal is the greater.

Pulse controller 71 receives, at its discharge enable (DE) input terminal, the output signal from comparator 69 and, at its charge enable (CE) input terminal, the output signal from comparator 70. A pulse signal, generated by process controller 11 to pulse controller 71, acts in conjunction with the signals applied to the DE and CE input terminals, to determine whether discharge or charge commands are to be issued to current pump 72 by pulse controller 71. The output signal of current pump 72 is applied through current-limiting resistor 74 to the charging/discharging electrode of loop filter capacitor 35. The voltage at this electrode is applied to the input terminal of amplifier 73, which output terminal is coupled to the (+) input terminal of comparator 69 and to the (−) input terminal of comparator 70. Amplifier 73 is a high impedance operational amplifier which is preferably configured in a voltage follower mode.

Pulse controller 71 provides a gating function of the discharge enable and charge enable signals by the pulse signal from process controller 11. It also provides level shifting of the gated outputs so that the discharge and charge signals applied to current pump 72 have sufficient energy to drive its current-conducting devices.

Current pump 72 may comprise, for example, two drive transistors (not shown), of opposite conductivity types, connected in an emitter-booster configuration, and coupled between potentials which are selected such that the potential across the transistor pair exceeds the range of voltages to be applied to capacitor 35. The respective base electrodes of the drive transistors are coupled to the discharge and charge signals from pulse controller 71. The junction of the emitters of the current pump 72 drive transistors provide the output signal to charge and discharge capacitor 35. In the emitter booster configuration, when neither drive transistor is enabled, current pump 72 appears as an extremely high impedance device to capacitor 35. Thus, no appreciable amount of current leaks off capacitor 35 as a consequence of coupling current pump 72 directly to loop 30.

The prepositioning circuit of the FIG. 2 embodiment will be more completely understood in conjunction with the description of its operation. When phase lock loop 30 is operating at a fixed, stable frequency, the pulse signal from process controller 11 is disabled, and current pump 72 appears as a virtual open circuit to capacitor 35. Under this condition, phase detector 32 in conjunction with charge pump 41 maintains the voltage across capacitor 35 which is necessary to keep loop 30 locked in frequency.

Just prior to the instant where a frequency change is commanded, process controller 11 outputs an address to ROM 62. The data word stored at the memory 62 location so addressed is a digitally-encoded representation of the voltage required at the control input terminal of VCO 36 in order for that device to oscillate at the newly-chosen frequency.

A second data word, representing a digitally-encoded offset voltage, is added to the ROM 62 data word by adder 63 and is subtracted from the ROM 62 data word by subtracter 64. The digital output signals from adder 63 and subtracter 64 are converted to voltage levels by D/A converters 65 and 66, respectively. The combination of these voltage levels now represent a window into which the input voltage to VCO 36 is to be prepositioned.

The higher output voltage level, that one from D/A converter 65, is coupled through amplifier 67 to the (−) input terminal of comparator 69 where it is compared to the voltage level across capacitor 35. If the capacitor 35 voltage is higher than the high limit of the window, comparator 69 applies a signal to pulse controller 71 indicating that current pump 72 is to discharge capacitor 35. The lower output voltage level, that one from D/A converter 66, is coupled through amplifier 68 to the (+) input terminal of comparator 70 where it is compared to the voltage level across capacitor 35. If the capacitor 35 level is lower than the low limit of the window, comparator 70 applies a signal to pulse controller 71 indicating that current pump 72 is to supply charging current to capacitor 35.

At the time of the command for frequency change, process controller 11 alters the states of the frequency select signals coupled to frequency divider 31 to thereby change its division factor and generates a prepositioning pulse to pulse controller 71. The width of this pulse is determined as the time required to change from the frequency at one extreme of the band to the frequency at the other extreme, i.e., the worst case pulse width for this system. This pulse gates the appropriate signal from comparators 69 and 70 to current pump 72 which accordingly sources or sinks current from capacitor 35.

As the voltage across capacitor 35 changes in response to current supplied from or to current pump 72, the output of amplifier 73, responsive to that voltage, changes until it becomes equal to the voltage at either the (−) input terminal of comparator 69 or the (+) input terminal of comparator 70. At this instant the appropriate DE or CE signal is disabled, causing disablement of the corresponding discharge or charge signal to current pump 72. Thus, even if the pulse signal from process controller 11 is still present, the feedback loop including elements 69, 70, 71 and 73 ensures that prepositioning current is supplied to/from loop capacitor 35 only until the voltage across capacitor 35 achieves a predetermined level. Once the discharge and charge signals are disabled, current pump 72 appears as a virtual open circuit to loop 30, and fine tuning can proceed using the loop elements, namely, phase detector 32 and charge pump 41.

Other embodiments of the present invention will be apparent to those skilled in the art to which it pertains. The scope of this invention is not intended to be limited to the embodiments disclosed herein but should instead be gauged by the breadth of the claims which follow.

What is claimed is:

1. In a phase lock loop including a loop filter capacitor and a voltage-controlled oscillator (VCO), wherein said VCO is responsive to the dc voltage level at one electrode of said capacitor for determining the frequency of oscillation of said VCO, an apparatus for altering said oscillation from a first frequency to a second frequency, said apparatus comprising:
    source means for providing a dc signal having a voltage level corresponding to said second frequency;
    means for comparing said source means dc signal voltage level with said capacitor dc level; and
    means responsive to said comparing means for providing current to said capacitor when the voltage level of said source means dc signal is unequal to the dc voltage level at said capacitor electrode.

2. The apparatus according to claim 1 wherein said source means includes:
    means for storing digital representations of voltage levels; and means for converting said digital representations to electrical signals having said represented voltage levels.

3. The apparatus according to claim 1 wherein said means for providing current includes a current pump having first and second control terminals.

4. The apparatus according to claim 3 wherein said comparing means generates a first control signal at said first control terminal of said current pump when said capacitor dc voltage level exceeds said source means dc voltage level and generates a second control signal at said second control terminal of said current pump when said capacitor dc voltage level is less than said source means dc voltage level.

5. The apparatus according to claim 4 further including pulse generating means for generating a pulse of predetermined duration, and wherein said means for providing current further includes means for gating said control signals to said current pump control terminals only during said duration of said pulse.

6. In a phase lock loop including a loop filter capacitor and a voltage-controlled oscillator (VCO), wherein said VCO is responsive to the dc voltage level at one electrode of said capacitor for determining the frequency of oscillation of said VCO, an apparatus for altering said oscillation from a first frequency to a second frequency, said apparatus comprising:

source means for generating first and second dc signals having different voltage levels corresponding, respectively, to frequencies below and above said second frequency;

means for comparing said source means dc signal voltage levels with said capacitor dc voltage level; and means responsive to said comparing means for providing charging current to said capacitor when the voltage level of said source means first dc signal exceeds the dc voltage level at said capacitor electrode and for providing discharging current to said capacitor when the voltage level of said source means second dc signal is less than the dc voltage level at said capacitor electrode.

7. The apparatus according to claim 6 wherein said source means includes:

means for storing digital representations of voltage levels; and means for converting said digital representations to electrical signals having said represented voltage levels.

8. The apparatus according to claim 7 wherein said source means further includes:

means for augmenting the value of said digital representations by an offset value; and means for diminishing the value of said digital representations by said offset value;

said augmenting means and said diminishing means being coupled between said storing means and said converting means.

9. The apparatus according to claim 8 wherein said converting means includes first and second digital-to-analog converters coupled, respectively, to said diminishing means and said augmenting means for generating said first and second signals.

10. The apparatus according to claim 6 wherein said means for providing current includes a current pump having first and second control terminals.

11. The apparatus according to claim 10 wherein said comparing means generates a first control signal at said first control terminal of said current pump when said capacitor dc voltage level exceeds said first signal dc voltage level and generates a second control signal at said second control terminal of said current pump when said capacitor dc voltage level is less than said second signal dc voltage level.

12. The apparatus according to claim 11 further including pulse generating means for generating a pulse of predetermined duration, and wherein said means for providing current further includes means for gating said control signals to said current pump control terminals only during said duration of said pulse.

13. The apparatus according to claim 11 wherein said comparing means includes first and second voltage comparators.

* * * * *